(12) United States Patent
Yoko et al.

(10) Patent No.: US 8,803,545 B2
(45) Date of Patent: Aug. 12, 2014

(54) SEMICONDUCTOR DEVICE SEMICONDUCTOR DEVICE TESTING METHOD, AND DATA PROCESSING SYSTEM

(75) Inventors: Hideyuki Yoko, Tokyo (JP); Kentaro Hara, Fukuoka (JP); Ryuji Takishita, Fukuoka (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 582 days.

(21) Appl. No.: 12/929,330

(22) Filed: Jan. 14, 2011

(65) Prior Publication Data

US 2011/0175639 A1     Jul. 21, 2011

(30) Foreign Application Priority Data

Jan. 18, 2010   (JP) ................... 2010-008267

(51) Int. Cl.
*G01R 31/26* (2014.01)
(52) U.S. Cl.
USPC ............. 324/762.06; 324/762.01; 257/48
(58) Field of Classification Search
USPC ............. 324/750.03, 762.01, 762.02, 762.06; 438/14–18; 714/733–734
See application file for complete search history.

(56) References Cited

U.S. PATENT DOCUMENTS

| | | | |
|---|---|---|---|
| 6,189,121 B1 * | 2/2001 | Ogawa | 714/733 |
| 7,000,164 B2 * | 2/2006 | Siegel et al. | 714/731 |
| 7,269,772 B1 * | 9/2007 | Li et al. | 714/733 |
| 7,516,377 B1 * | 4/2009 | Buchanan | 714/726 |
| 2007/0030020 A1 * | 2/2007 | Kinsley | 324/760 |
| 2009/0013228 A1 * | 1/2009 | Jarboe et al. | 714/733 |
| 2009/0153177 A1 | 6/2009 | Shibata | |

FOREIGN PATENT DOCUMENTS

| | | |
|---|---|---|
| JP | 2000-214221 | 8/2000 |
| JP | 2001-344993 | 12/2001 |
| JP | 2007-212279 | 8/2007 |
| JP | 2009-139273 A | 6/2009 |

OTHER PUBLICATIONS

Stan Gibilisco, The Illustrated Dictionary of Electronics 237 (8th ed. 2001).*

* cited by examiner

*Primary Examiner* — Arleen M Vazquez
*Assistant Examiner* — Robert P Alejnikov, Jr.
(74) *Attorney, Agent, or Firm* — McGinn IP Law Group, PLLC

(57) ABSTRACT

To provide a semiconductor device including an interface chip and a core chip and a measurement-target signal line and a reference signal line each including a through silicon via provided in the core chip and electrically connecting the interface chip and the core chip. The interface chip outputs a test clock generated by a first signal generation circuit to the core chip. The core chip includes a second signal generation circuit that generates a predetermined measurement signal from the test clock, and outputs the predetermined measurement signal to the measurement-target signal line and the reference signal line in a simultaneous manner. Further, the interface chip detects a phase difference of a plurality of predetermined measurement signals input via the measurement-target signal line and the reference signal line by an operational amplifier, and outputs a test result to a determination circuit.

20 Claims, 9 Drawing Sheets

SEMICONDUCTOR DEVICE SEMICONDUCTOR DEVICE TESTING METHOD, AND DATA PROCESSING SYSTEM

BACKGROUND OF THE INVENTION

1. Field of the Invention

The present invention relates to a semiconductor device, a semiconductor device testing method, and a data processing system, and more particularly relates to a semiconductor device constituted by a plurality of core chips and an interface chip that controls the core chips, a semiconductor device testing method, and a data processing system.

2. Description of the Related Art

A memory capacity that is required in a semiconductor memory device such as a DRAM (Dynamic Random Access Memory) are increasing every year. To satisfy this requirement, in recent years, a memory device that is called a multi-chip package where plural memory chips are laminated is suggested. However, since the memory chip used in the multi-chip package is a common memory chip capable of operating even though the memory chip is a single chip, a so-called front end unit that performs a function of an interface with an external device (memory controller, for example) is included in each memory chip. For this reason, the occupied area assignable for a memory core in each of the memory chips is limited to an area obtained by subtracting an occupied area for the front end unit from the whole chip area. Therefore, it is difficult to greatly increase a memory capacity for each chip.

In addition, a circuit that constitutes the front end unit is manufactured at the same time as a back end unit including a memory core, regardless of the circuit being a circuit of a logic system. Therefore there have been a further problem that it is difficult to speed up the front end unit.

As a method to resolve the above problem, a method that integrates the front end unit and the back end unit separately in discrete chips and laminates these chips, thereby constituting one semiconductor memory device, is suggested. According to this method, with respect to core chips in which the back end unit is integrated, it becomes possible to increase a memory capacity for each chip because an occupied area assignable for the memory core increases. Meanwhile, with respect to an interface chip that is integrated with the front end unit and is common to the plural core chips, it becomes possible to form its circuit with a high-speed transistor because the interface chip can be manufactured using a process different from that of the memory core. In addition, since the plural core chips can be allocated to one interface chip, it becomes possible to provide a semiconductor memory device that has a large memory capacity and a high operation speed as a whole.

In a semiconductor device using an interface chip, adjacent chips are electrically connected to each other by a large number of through silicon vias passing through substrates of core chips. Most of the through silicon vias are short-circuited to through silicon vias in other layers provided at same positions as seen in a planar view from a laminated direction. A current path for connecting the interface chip to each core chip is formed by a group of electrically short-circuited through silicon vias.

Japanese Patent Application Laid-open No. 2009-139273 discloses a testing technique for confirming a connection state of an internal terminal connecting a through silicon via to an internal circuit, although this is an example of a multi-chip package. According to the laminated configuration of this technique, internal terminals at the same position of a plurality of isomorphic memory core chips 2 are connected to each other via through silicon vias 4 with internal terminal junctions 3. These internal terminals are connected to an external terminal 5 by a wiring on an interposer chip 1 (not shown). The interposer chip 1 includes a unit that connects a wiring pattern to the external terminal 5 (for example, a through silicon via and a bonding pad (not shown)). This unit has a function to convert a position of the internal terminal with a position of the external terminal 5. That is, the external terminal 5 of the semiconductor device is electrically directly connected to any of the internal terminals that serve as a terminal to be measured in the semiconductor device. According to this testing technique, in the wiring configuration, a conduction check diode is provided in the midway of an internal wiring connecting the internal terminal to the internal circuit for each internal terminal, and its cathode side is connected to the internal wiring. A conduction test dedicated terminal is provided at an external terminal of a corresponding multi-chip package (a semiconductor device) for each memory chip and an anode of each conduction check diode within a same memory chip is commonly connected to the conduction test dedicated terminal. When the connection state of a certain internal terminal is tested, a voltage of −1 V is applied to a current path including the corresponding through silicon via through the external terminal and a voltage of 0 V is applied to the corresponding conduction test dedicated terminal. As a result, a forward current of the conduction check diode flows through the current path when the internal terminal is properly connected and the current do not flow when the internal terminal is disconnected. Therefore, by measuring the current appearing in the external terminal using a tester outside the semiconductor device, whether the internal terminal within the semiconductor device is properly connected can be determined.

The through silicon via has a parasitic resistance and a parasitic capacitance. Therefore, there is a delay of a signal in a current path that connects the interface chip and each of the core chips by an amount corresponding to a time constant caused by the parasitic resistance and the parasitic capacitance of the through silicon via. Because it is not desirable that a delay amount is different for each current path (that is, the time constant is different for each through silicon via, or alternate-current (AC) characteristics are different therefor), it is required to perform a confirmation test to make sure that there is no considerable difference between delay amounts in a plurality of current paths.

SUMMARY

In one embodiment, there is provided a semiconductor device comprising: an interface chip; a core chip; and a measurement-target signal line and a reference signal line each including a through electrode penetrating through the core chip and each having a first end provided on the core chip and a second end provided on the interface chip, wherein the interface chip includes a first signal generation circuit that generates a test clock, the core chip includes a second signal generation circuit that generates a measurement signal in synchronization with the test clock, and outputs the measurement signal to the first ends on the core chip of the measurement-target signal line and the reference signal line, and the interface chip further includes a determination circuit (decision circuit) that outputs a test result signal based on a phase difference between the measurement signals respectively appearing at the second ends on the interface chip of the measurement-target signal line and the reference signal line.

In another embodiment, there is provided a testing method of a semiconductor device comprising: proving the semiconductor device that includes a core chip including a plurality of through electrodes penetrating therethrough and an interface chip stacked on the core chip, the through electrodes constitute a first signal line, a measurement-target signal line, and a reference signal line that are connected between the core chip and the interface chip, respectively; outputting a test clock having a predetermined cycle from the interface chip to the first signal line; generating a measurement signal in the core chip in synchronization with the test clock supplied via the first signal line and outputting the measurement signal to the measurement-target signal line and the reference signal line in a simultaneous manner; and detecting a phase difference of a plurality of the measurement signals on the interface chip respectively supplied via the measurement-target signal line and the reference signal line.

According to the present invention, in a semiconductor device of a type using an interface chip, it is possible to perform a confirmation test to make sure that there is no considerable difference in AC characteristics between a plurality of current paths respectively related to a plurality of through silicon vias between the interface chip and the core chips.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of a technical concept for solving the problem of the present invention is described below. It is needless to mention that the contents that the present application is to claim for patent are not limited to the following technical concept, but to the description of the appended claims. That is, the present invention relates to a semiconductor device of a type using an interface chip, which includes a plurality of through silicon vias respectively provided to core chips, and performs a confirmation test to make sure that there is no considerable difference in the delay amount (time constant, AC characteristics) between a measurement-target signal line that electrically connects the interface chip and the core chip and a reference signal line. The interface chip includes a first signal generation circuit that generates a test clock having a predetermined cycle and outputs the test clock to the core chip. The core chip includes a second signal generation circuit that generates a predetermined measurement signal in synchronization with the test clock and outputs the predetermined measurement signal to each of a plurality of ends of the core chip that is connected with the measurement-target signal line and the reference signal line. The interface chip further includes a comparator that detects a phase difference between a plurality of measurement signals respectively appearing at a plurality of ends of the interface chip that is connected with the measurement-target signal line and the reference signal line and a determination circuit that outputs a test result based on an output of the comparator. With this configuration, it is possible to perform a confirmation test to make sure that there is no considerable difference in the delay amount (time constant) between the measurement-target signal line and the reference signal line by referring to the test result output from the determination circuit. As a result, it is possible to verify time constants (AC characteristics) of a plurality of signal lines including a plurality of through silicon vias respectively connecting the interface chip and the core chips in a layered structure.

Preferred embodiments of the present invention will be explained below in detail with reference to the accompanying drawings.

Figure 1:
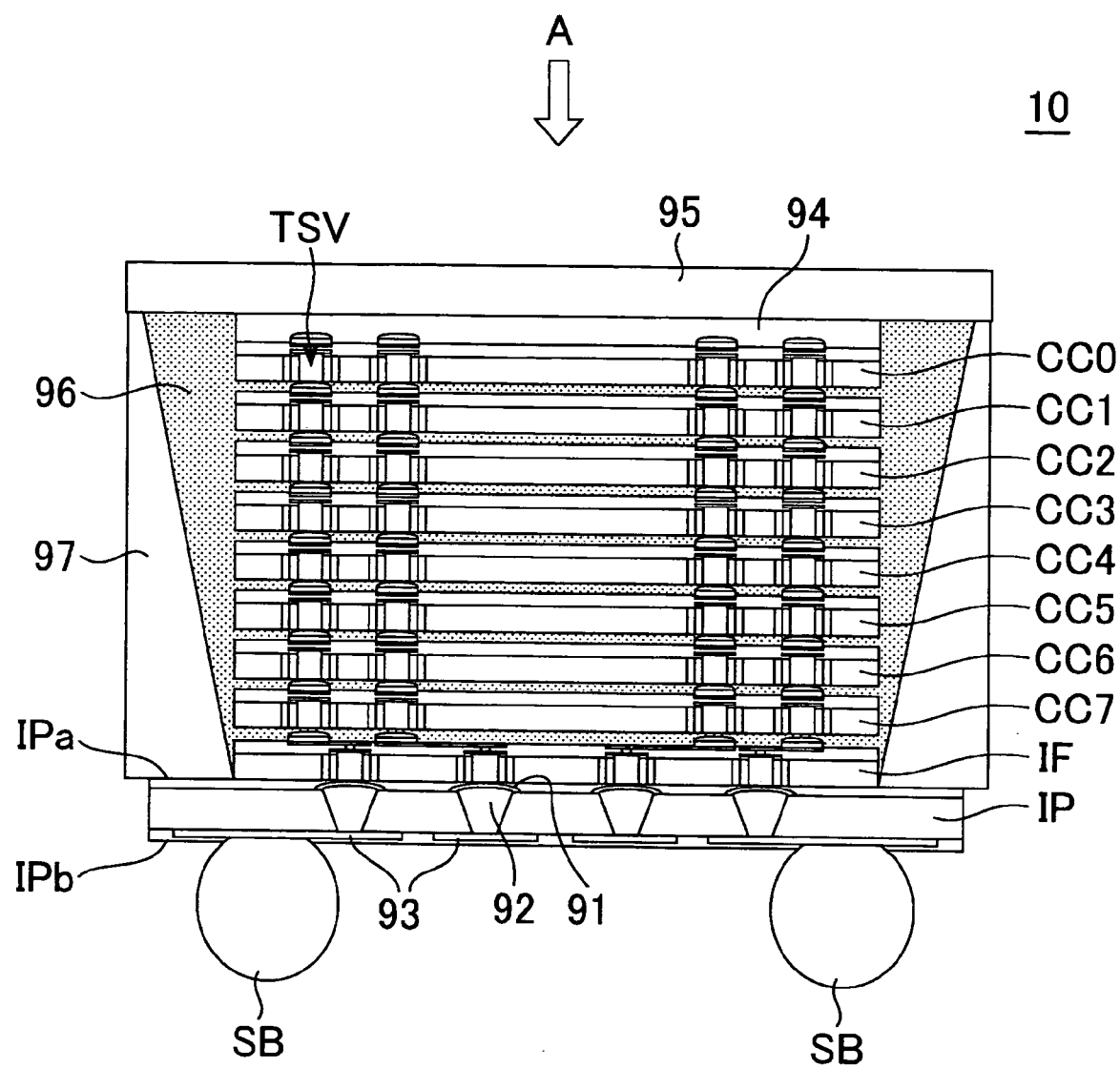
FIG. 1 is a schematic cross-sectional view provided to explain the structure of a semiconductor memory device according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural through silicon vias TSV penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes both of the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing, of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit (a processing circuit processing signals to communicate with the eight core chips CC0 to CC7 and a processing circuit processing signals from/to the external.) for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
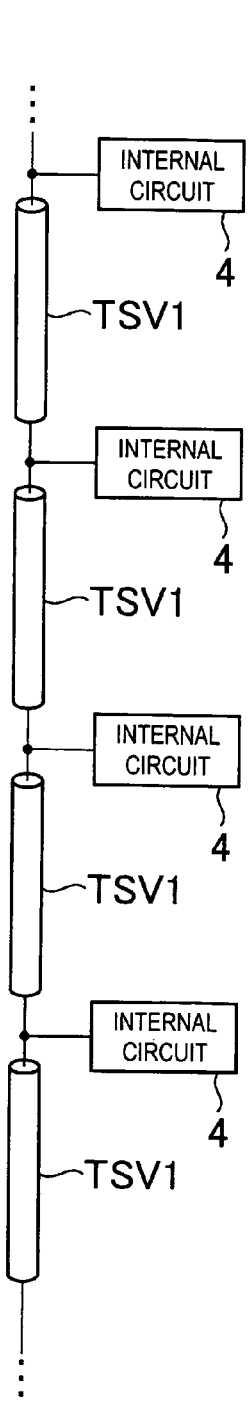
FIGS. 2A to 2C are diagram showing the various types of through silicon vias TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plan view are short-circuited, and one current path (an internal signal line) is configured by the through silicon vias TSV1. The through silicon vias TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Figure 2B:
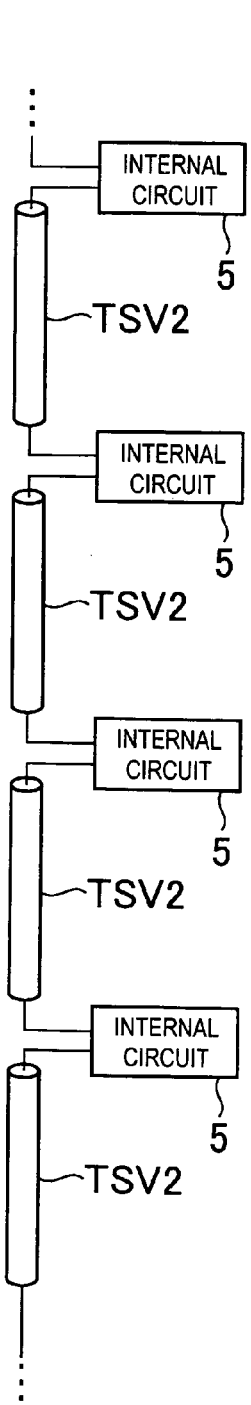

Meanwhile, as shown in FIG. 2B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits that are provided in the core chips CC0 to CC7 are cascade-connected through the through silicon vias TSV2 and the current path (the internal signal line) configured by the through silicon vias TSV2 includes the internal circuits 5. This kind of through silicon vias TSV2 is used to sequentially transmit predetermined information to the internal circuits 5 provided in the core chips CC0 to CC7. As this information, layer address information to be described below is exemplified.

Figure 2C:
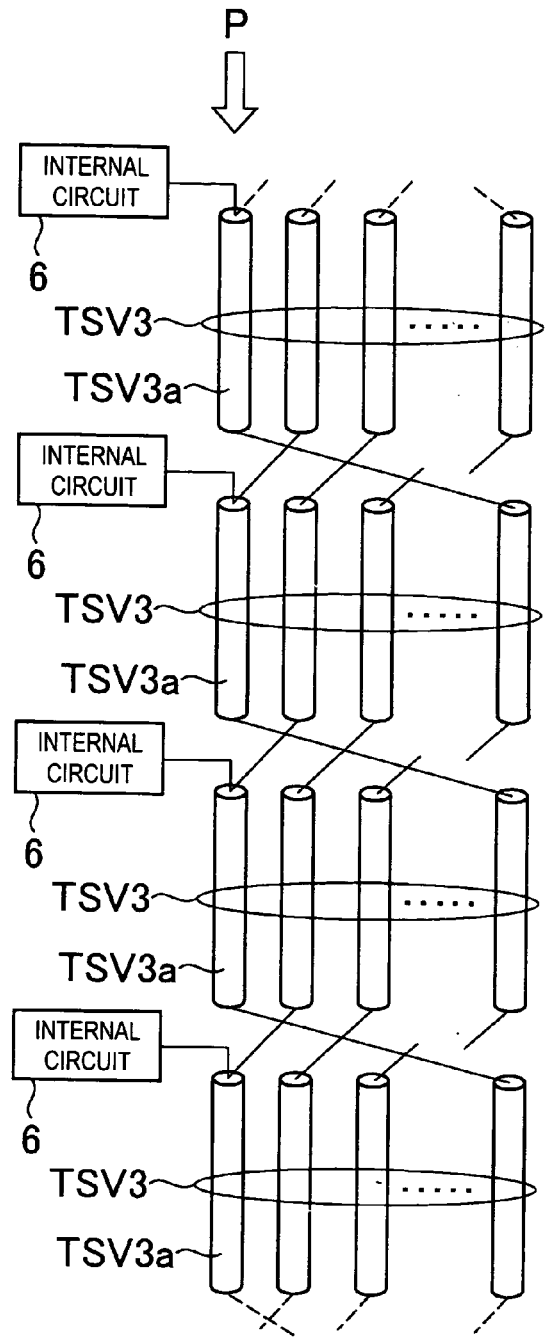

Another through silicon via TSV group is short-circuited from the through silicon via TSVs of other layer provided at the different position in plan view, as shown in FIG. 2C. With respect to this kind of through silicon via TSV group 3, internal circuits 6 of the core chips CC0 to CC7 are connected to the TSV3a provided at the predetermined position P in plan view. Each of the current paths (the internal signal lines) configured by the through silicon vias TSV3 is connected to the internal circuit 6 provided in only one of the core chips, respectively. Thereby, information can be selectively input to the internal circuit 6 provided in each of the core chips. As this information, defective chip information described below is exemplified.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal, a command signal, and a clock signal are supplied from the interface chip IF to the core chips CC0 to CC7, through the through silicon vias TSV1 of the type shown in FIG. 2A. Read data and write data are also input to and output from the interface chip IF through the through silicon vias TSV1 of the type shown in FIG. 2A. Meanwhile, the through silicon vias TSV2 and through silicon vias TSV3 of the types shown in FIGS. 2B and 2C are used to provide individual information to the core chips CC0 to CC7 having the same structure.

Figure 3:
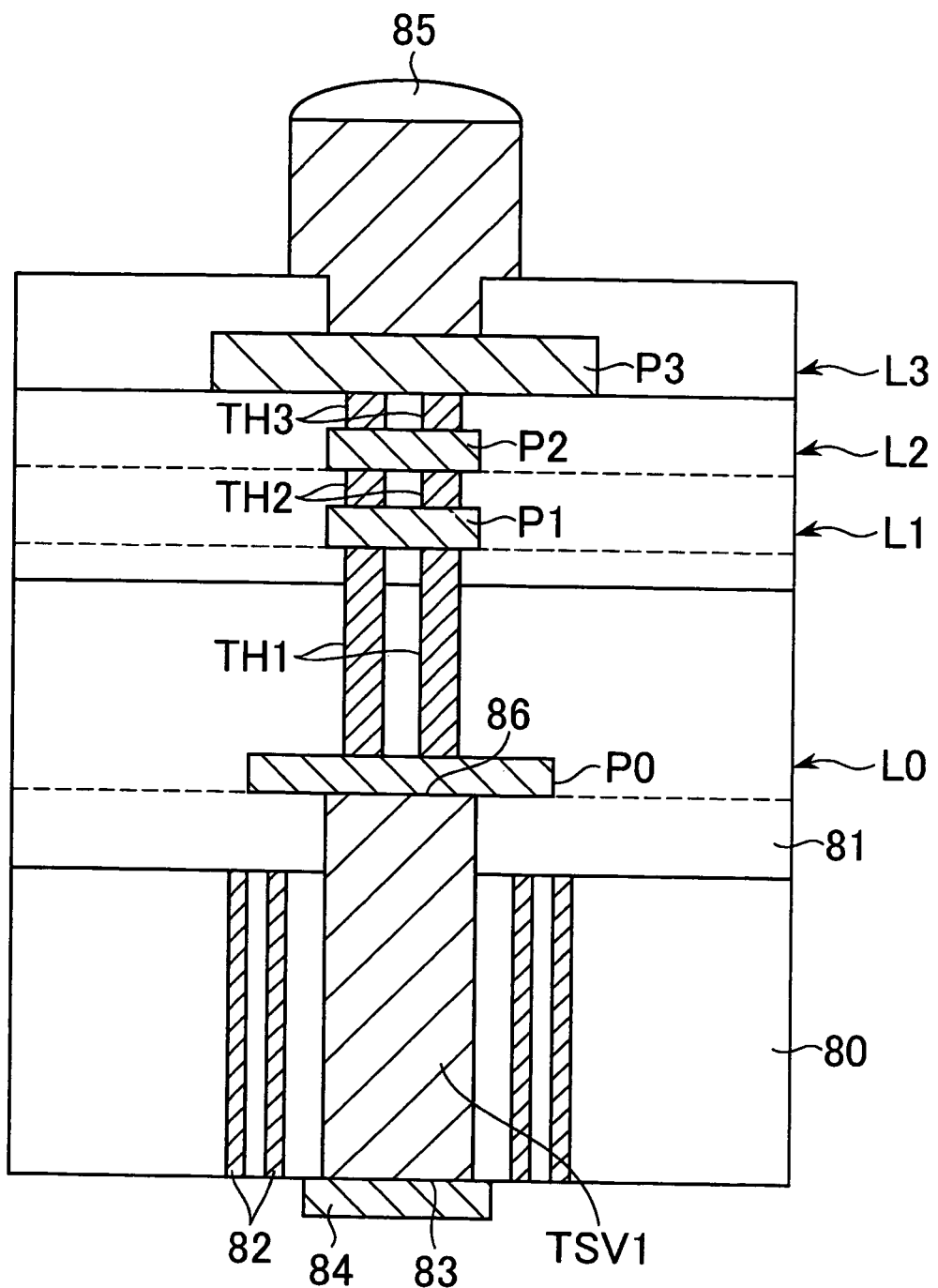
FIG. 3 is a cross-sectional view illustrating the structure of the through silicon via of the type shown in FIG. 2A.

FIG. 3 is a cross-sectional view illustrating the structure of the through silicon via TSV1 of the type shown in FIG. 2A.

As shown in FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plan view are short-circuited. Connection with internal circuits (not shown in the drawings) is performed through internal wiring lines (not shown in the drawings) drawn from the pads P0 to P3 provided in the wiring layers L0 to L3.

Figure 4:
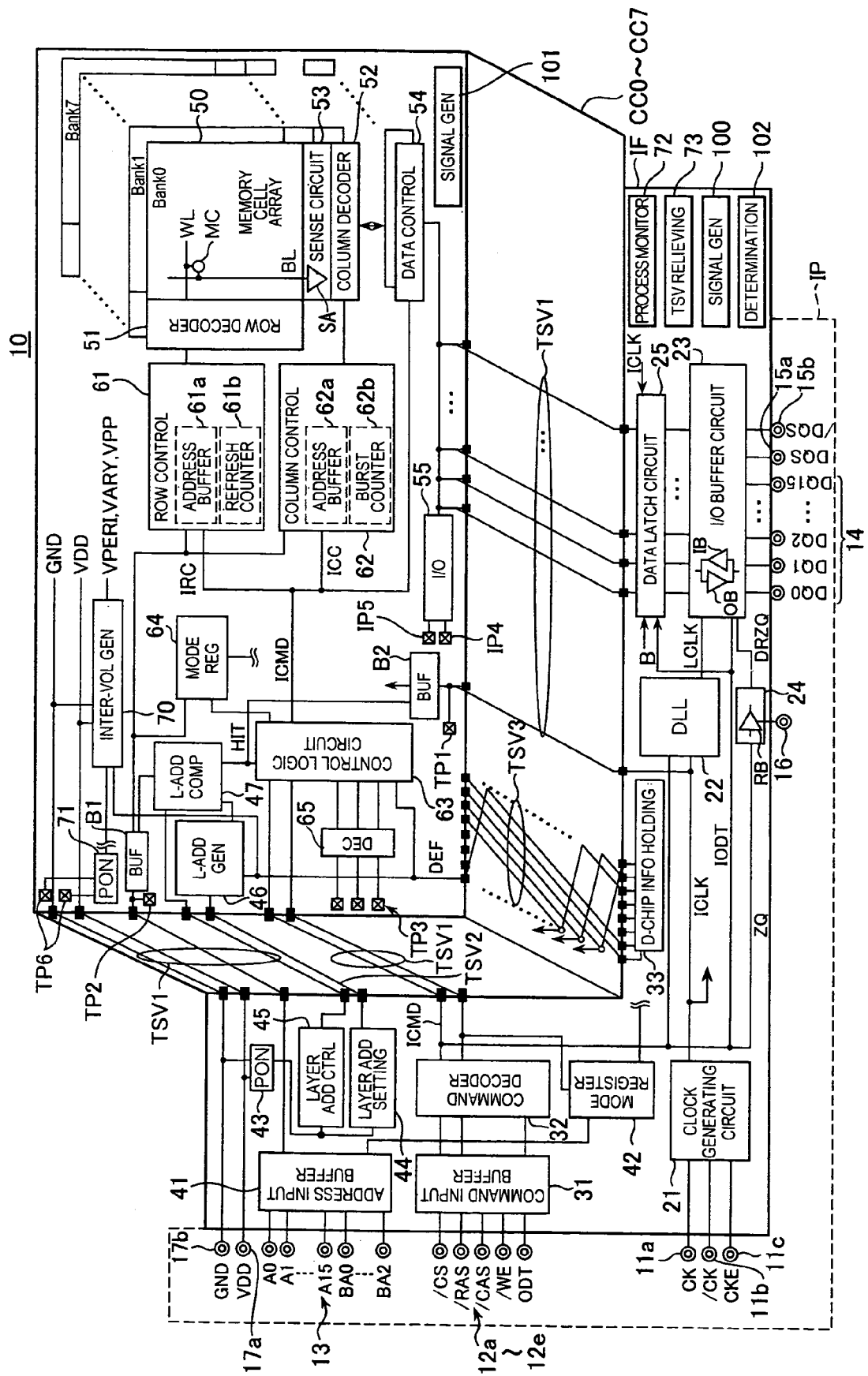
FIG. 4 is a block diagram illustrating the circuit configuration of the semiconductor memory device according the embodiment of the present invention.

FIG. 4 is a block diagram illustrating the circuit configuration of the semiconductor memory device 10.

As shown in FIG. 4, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each bank of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested incase an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV. The power-on detecting circuit 43 detects the supply of power. On detecting the supply of power, the power-on detecting circuit activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, using the through silicon via TSV3 of the type shown in FIG. 2C.

A process monitor 72, a TSV relieving circuit 73, a signal generation circuit 100, and a determination circuit 102 are also provided in the interface chip IF. The process monitor circuit 72 is at least a circuit for measuring device characteristics of each core chip to code them. This coding enables the timing of each core chip to be adjusted. Specifically, an inverter chain circuit that can vary steps is provided in the interface chip IF and the core chip, the number of steps is adjusted so that their delay times are equal to each other, and a difference in the number of steps is coded. Details of the TSV relieving circuit 73, the signal generation circuit 100, and the determination circuit 102 are described later.

The above description is the outline of the connection relationship between the external terminals and the interface chip IF and the circuit configuration of the interface chip IF. Next, the circuit configuration of the core chips CC0 to CC7 will be described.

As shown in FIG. 4, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the banks share the external terminals (for example, plural control terminals and plural I/O terminals) of the semiconductor memory device 10. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers, for example) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the through silicon via TSV and a layer address LID (chip identification information) set to the layer address generating circuit 46.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI ($\approx$VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

A signal generation circuit 101 is also provided in the core chips CC0 to CC7. Details of the signal generation circuit 101 are described later.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal, a test data, or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

The kind of the test pads TP is almost the same as those of the external terminals provided in the interposer IP. Specifically, the test pads TP include a test pad TP1 supplied with the clock signal, a test pad TP2 supplied with the address signal, test pads TP3 supplied with the command signal, a test pad TP4 for performing input/output of test data, a test pad TP5 for performing input/output of data strobe signal, test pads 6 for supplying power-supply voltages.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 GB are laminated, the semiconductor memory device 10 has a memory capacity of 8 GB in total. Because the chip selection signal /CS is input to one terminal (chip selection terminal), the semiconductor memory device is recognized as a single DRAM having the memory capacity of 8 GB, in view of the controller.

A configuration of a test circuit that performs a confirmation test to make sure that there is no considerable difference in the delay amount between the current paths is explained below. In the following descriptions, while an internal signal line constituted by the through silicon via TSV1 as shown in FIG. 2A is described, the present invention can be applied to internal signal lines constituted by other types of through silicon vias. Note that the electrodes 91 formed on the top surface IPa of the interposer IP, the through-hole electrodes 92, and the re-wiring layers 93, these are related to the external terminals SB, are different from the through silicon vias TSV connecting the interface chip IF and the core chips. That is, it is not possible to perform the test of the through silicon vias TSV in a direct manner from the external terminals SB. The external terminals SB that are used for the semiconductor device 10 to communicate with outside (which is connected to the system bus 510 shown in FIG. 9) are connected to an input terminal of a first circuit (for example, the input/output buffer circuit 23) included in the interface chip IF, and an output terminal of the first circuit is connected to a measurement-target signal line (TSV1 shown in FIG. 4) that is connected to an end of the interface chip.

Figure 5:
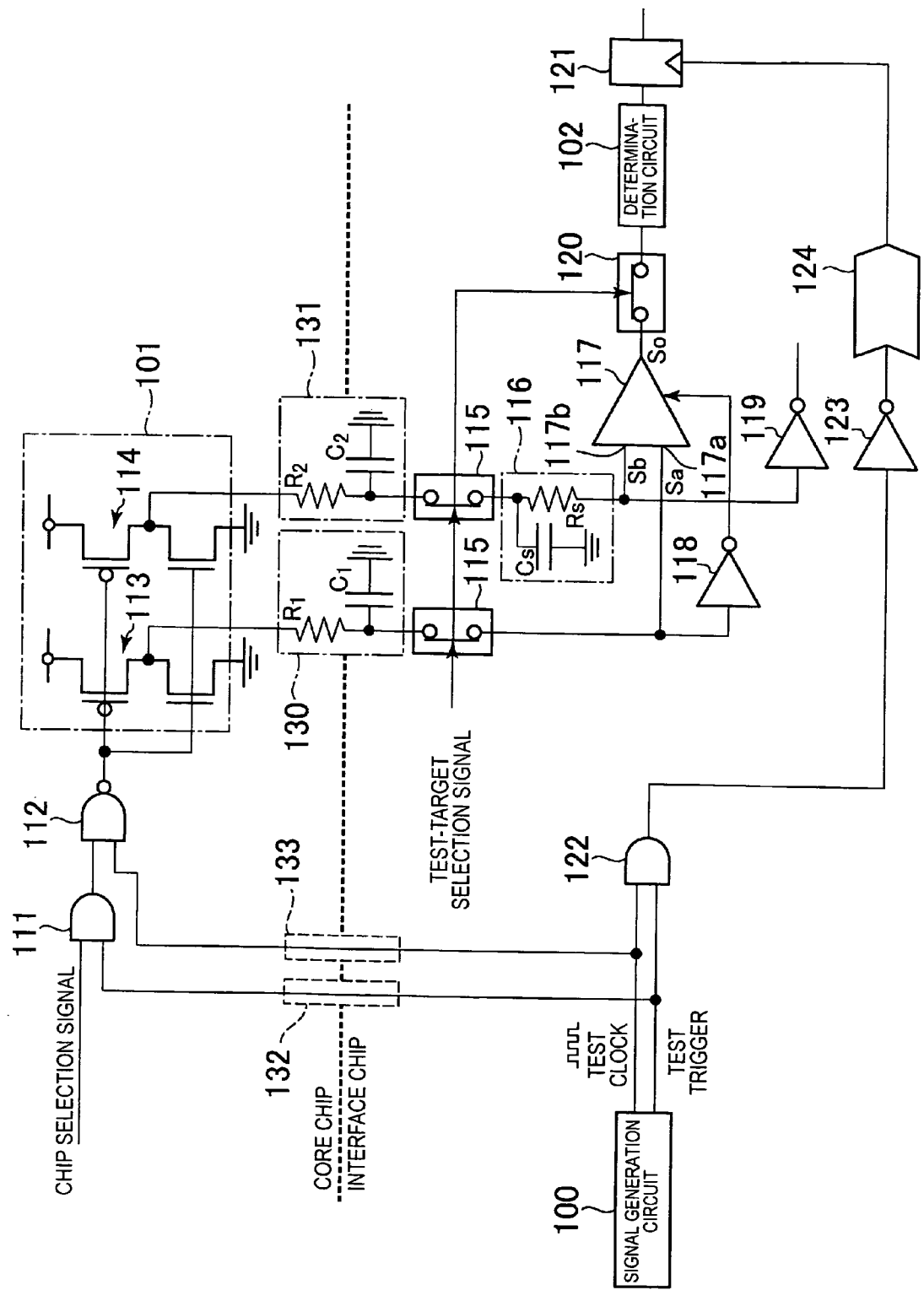
FIG. 5 is a circuit diagram showing the configuration of the test circuit of the semiconductor device according to the embodiment of the present invention.

FIG. 5 is a circuit diagram showing the configuration of the test circuit of the semiconductor device 10 according to the present embodiment. Although only one core chip is shown in FIG. 5, the same circuit is provided in all the core chips CC0 to CC7.

As shown in FIG. 5, the semiconductor device 10 includes the signal generation circuit 100, the signal generation circuit 101, and the determination circuit 102.

The signal generation circuit 100 (first signal generation circuit) is a circuit that generates a test trigger and a test clock in response to a signal input from outside. The test trigger is a test-mode entry signal that is activated when performing a confirmation test and deactivated if it is not the case. The test clock is a signal that is generated when the test trigger is activated, which has at least one active edge during a period in which the test trigger is activated. Although the active edge means rising of a signal in the present embodiment, it may mean falling of the signal or may mean both the rising and the falling of the signal. More specifically, the test clock can be a clock that makes a transition from a first potential to a second potential, a single clock such as a one-shot pulse, a plurality of single clocks in time series, and a signal cycle having a predetermined frequency that can be detected by an operational amplifier 117 described later. An example of the signal cycle having three active edges is shown in FIG. 5. Although the test clock is generated by the interface chip IF in the present example, a local oscillator circuit can be provided on the core chip side so that the test clock can be supplied from the local oscillator circuit.

The test trigger and the test clock generated by the signal generation circuit 100 are input to the signal generation circuit 101 (second signal generation circuit). When the test trigger is activated, the signal generation circuit 101 generates a predetermined measurement signal in response to the test clock and outputs it to an end in the core chip of each of an internal signal line 130 of a measurement target (hereinafter, "measurement-target signal line 130") and an internal signal line 131 that becomes a reference (hereinafter, "reference signal line 131").

The determination circuit 102 generates a test result based on a phase difference of the measurement signal appearing at an end in the interface chip of each of the measurement-target signal line 130 and the reference signal line 131 and outputs the test result.

A specific circuit configuration for realizing the above functions of each of the circuits is explained below.

The test trigger and the test clock generated by the signal generation circuit 100 are transferred to the core chip side through an internal signal line 132 (second signal line) and an internal signal line 133 (first signal line) for the test, which are secured in advance, respectively. The internal signal line 133 (first signal line) electrically connects an end of the interface chip IF (first end) and an end of the core chip (second end). The internal signal line 132 (second signal line) electrically connects an end of the interface chip (third end) and an end of the core chip (fourth end). Each of the internal signal line 132 (second signal line) and the internal signal line 133 (first signal line) includes a through silicon via TSV. It is preferable to prepare backup internal signal lines for the internal signal lines 132 and 133 so that they can be switched as necessary.

An AND circuit 111 (chip-selection reception circuit) and a NAND circuit 112 are provided in the core chip. The test trigger generated by the signal generation circuit 100 and a chip selection signal (chip identification signal: Layer ID) for selecting a specific core chip are input to the AND circuit 111. The AND circuit 111 activates its output when both the test trigger and the chip selection signal are activated.

The test clock generated by the signal generation circuit 100 and an output of the AND circuit 111 are input to the NAND circuit 112. The NAND circuit 112 outputs an inverted signal of the test clock while the output of the AND circuit 111 is activated.

The signal generation circuit 101 includes transfer gates 113 and 114 each configured with a P-channel MOS transistor and an N-channel MOS transistor connected in series between a power source potential and a ground potential. An output of the NAND circuit 112 is input to each of the transfer gates constituting the transfer gates 113 and 114. Therefore, each of the transfer gates 113 and 114 outputs an alternate-current signal having the same waveform as the test clock while the test trigger is activated. That is, each of the transfer gates 113 and 114 outputs an alternate-current signal having an active edge corresponding to an active edge of the test clock, in other words, an alternate-current signal that rises at rising of the test clock and falls at falling of the test clock. This alternate-current signal becomes the measurement signal described above.

The measurement signals output from the transfer gates 113 and 114 are input to ends of the measurement-target signal line 130 and the reference signal line 131 in the core chip, respectively. Although the input measurement signals are output to ends at the interface chip IF side through the signal lines 130 and 131, respectively, because each of the signal lines 130 and 131 has the parasitic resistance and the parasitic capacitance as shown in FIG. 5, there occurs a slight delay in output measurement signals. The determination circuit 102 generates the test result based on a difference in the amount of this delay.

The difference of the amount of the delay is detected by the operational amplifier 117 (phase comparison circuit) as a phase difference. One input terminal 117a of the operational amplifier 117 is connected to the end of the measurement-target signal line 130 at the interface chip IF side through a switch 115. Likewise, the other input terminal 117b of the operational amplifier 117 is connected to the end of the reference signal line 131 at the interface chip IF side through a switch 115 and a delay element 116.

The operational amplifier 117 detects a phase difference between a measurement signal input to the input terminal 117a (hereinafter, "test signal Sa") and a measurement signal input to the input terminal 117b (hereinafter, "reference signal Sb") based on an active edge of these signals and outputs the result of the detection as an output signal (hereinafter, the output signal So). Specifically, the operational amplifier 117 activates the output signal So when the active edge of the test signal Sa is delayed with respect to the active edge of the reference signal Sb, and deactivates the output signal So if it is not the case.

The delay element 116 is to delay (to offset) the measurement signal output from the reference signal line 131 in an intentional manner. That is, when the delay element 116 is not used, the output of the operational amplifier 117 becomes unstable when there is no difference between the delay amount of the measurement-target signal line 130 and the delay amount of the reference signal line 131. To handle this problem, the delay element 116 is provided to intentionally generate a difference in the delay amount. For example, as shown in FIG. 5, the delay element 116 is configured with an RC filter that includes a resistive element connected to the circuit in series and a capacitive element connected between the circuit and the ground. However, the delay element 116 can be also configured with other signal delay circuits.

The switch 115 is a switch for selecting one measurement-target signal line 130 and one reference signal line 131 when there are a plurality of measurement-target signal lines 130 and a plurality of reference signal lines 131. The test-target selection signal only switches on a switch 115 that is connected to the measurement-target signal line 130 and the reference signal line 131 that are subject to the test, while the other switches 115 are switched off. In addition, although not shown in the drawings, similar switches are also provided at the end of the measurement-target signal line 130 and the reference signal line 131 at the core chip side. The test-target selection signal is described in detail later.

An inverted signal of the measurement signal output from the end of the measurement-target signal line 130 at the interface chip IF side is input to the operational amplifier 117 via an inverter 118. The operational amplifier 117 performs an output operation only when this inverted signal is activated.

A replica element 119, which is a replica element of the inverter 118 is connected to the reference signal line 131 at the interface chip IF side. The replica element is an element having the same electrical characteristics as its corresponding target element (in this case, the inverter 118). Preferably, it indicates an element having the same element structure as the target element, having the same impurity profile, the same W/L ratio, and the same thickness of the gate dielectric film as the target element, and being formed on the same substrate or a substrate of the same impurity concentration. The replica element 119 is used to uniform the electrical characteristics of the measurement-target signal line 130 and the reference signal line 131.

Figure 6A:
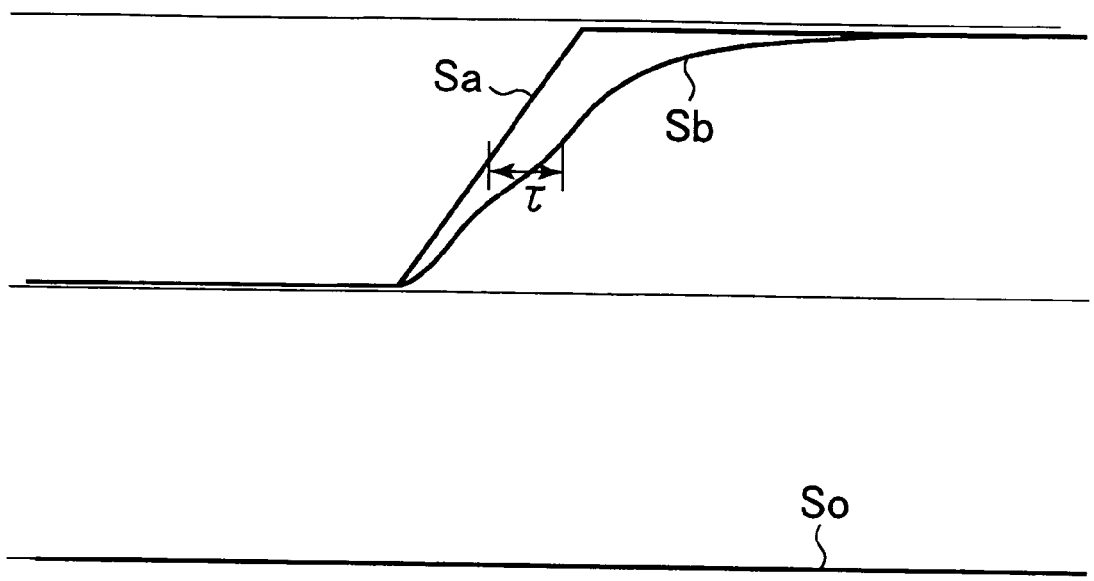
FIGS. 6A and 6B are graphs showing temporal changes of the signals Sa, Sb, and So near the active edge of the test clock when the measurement signal is input to each of the measurement-target signal line and the reference signal line from the second signal generation circuit.
Figure 6B:
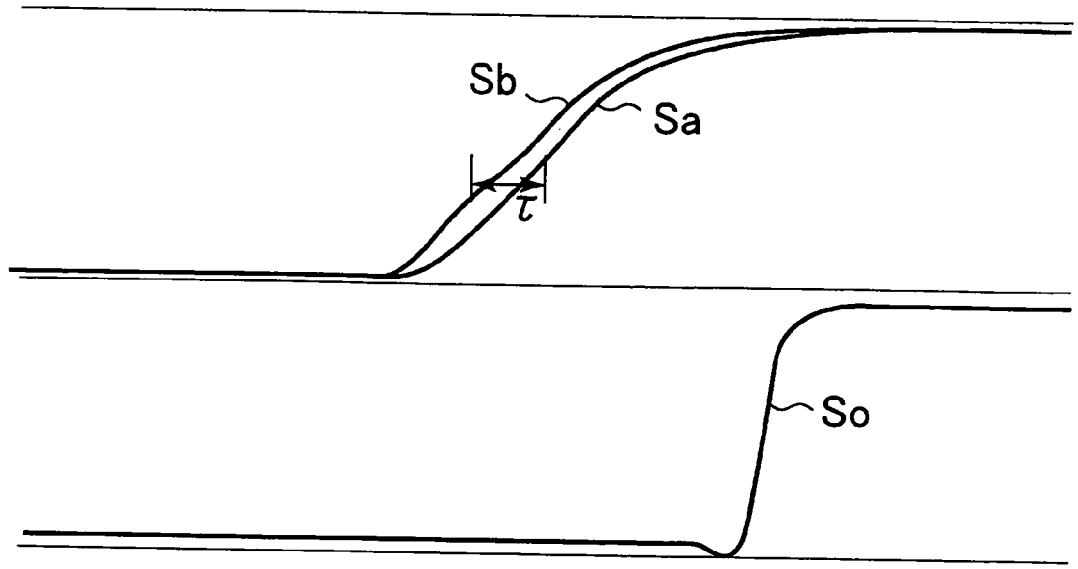

FIGS. 6A and 6B are graphs showing temporal changes of the signals Sa, Sb, and So near the active edge of the test clock when the measurement signal is input to each of the measurement-target signal line 130 and the reference signal line 131 from the signal generation circuit 101. FIG. 6A shows a normal case (in which there is no considerable difference in the delay amount between the measurement-target signal line 130 and the reference signal line 131), and FIG. 6B shows a case where the delay amount of the measurement-target signal line 130 is increased compared to the delay amount of the reference signal line 131.

The delay amount $\tau$ of the test signal Sa with respect to the reference signal Sb is represented by the following Equation (1), where R1 and C1 are parasitic resistance and parasitic capacitance of the measurement-target signal line 130, respectively, R2 and C2 are parasitic resistance and parasitic capacitance of the reference signal line 131, respectively, Rs and Cs are resistance and capacitance of a resistive element and a capacitive element constituting the delay element 116, respectively, and $\Delta$ is a proportional constant.

$$\tau = \Delta\{R1C1 - (R2+Rs)(C2+Cs)\} \quad (1)$$

As can be understood from the Equation (1), in a normal state (R1=R2 and C1=C2), $\tau = -\Delta RsCs$, where the reference signal Sb is delayed with respect to the test signal Sa by the amount of $\Delta RsCs$. Therefore, as shown in FIG. 6A, the output signal S0 of the operational amplifier 117 is remained to be low (low voltage state).

Meanwhile, when at least one of R1 and C1 is increased so that the state is changed to satisfy R1C1>(R2+Rs)(C2+Cs), $\tau$ becomes larger than zero from the Equation (1). That is, the test signal Sa becomes delayed with respect to the reference signal Sb. Therefore, as shown in FIG. 6B, the output signal So of the operational amplifier 117 is changed from low to high (high voltage state).

From the above descriptions, the fact that the output signal So of the operational amplifier 117 becomes high indicates that the delay amount of the measurement-target signal line 130 is larger than the delay amount of the reference signal line 131.

The determination circuit 102 generates the test result based on the output signal So of the operational amplifier 117. Specifically, the determination circuit 102 includes a plurality of storage circuits that store the detection result (the output signal So) of the operational amplifier 117, receives the output signal So of the operational amplifier 117 via a switch 120, and stores the output signal So in the storage circuits.

When the test clock is a single clock, the determination circuit 102 outputs a test result signal indicating a fail when the stored output signal So is high, and a test result signal indicating a pass when the stored output signal So is low. On the other hand, when the test clock is a signal cycle of n times, the determination circuit 102 outputs a test result signal indicating a fail when the number of times that the output signal So is high exceeds a predetermined ratio (or a predetermined number of times), and a test result signal indicating a pass when the number of times that the output signal So is high do not exceed the predetermined ratio (or the predetermined number of times).

The switch 120 is a switch for selecting one operational amplifier 117 when there is a plurality of measurement-target signal lines 130 and a plurality of reference signal lines 131 which are grouped and the operational amplifier 117 is provided for each group. The test-target selection signal only switches on a switch 120 that is connected to an operational amplifier 117 corresponding to a group to which the measurement-target signal line 130 and the reference signal line 131 that are subject to the test belong, while the other switches 120 are switched off.

The test result signal output from the determination circuit 102 is latched in a latch circuit 121. A delayed signal of an inverted signal of the test clock is input to a clock terminal of the latch circuit 121 via an AND circuit 122, an inverter 123, and a delay circuit 124. Specifically, the test clock and the test trigger are input to the AND circuit 122 from the signal generation circuit 100, and when the test trigger is activated, the AND circuit 122 outputs the test clock to the inverter 123. The inverter 123 inverts the test clock and outputs an inverted signal of the test clock to the delay circuit 124. The delay circuit 124 delays the inverted signal of the test clock input from the inverter 123 for a predetermined time, and outputs a delayed signal to the clock terminal of the latch circuit 121. The delay time in the delay circuit 124 is determined to activate the clock terminal of the latch circuit 121 at a timing at which the test result signal is input to the latch circuit 121 from the determination circuit 102. Therefore, when the test result signal is input from the determination circuit 102, the latch circuit 121 outputs the test result signal to a processing circuit at a subsequent stage (not shown).

The TSV relieving circuit 73 (see FIG. 4) performs a process of replacing an internal signal line having a large delay amount with a backup internal signal line by a process similar to relieving of a memory cell and the like, based on the test result signal output from the latch circuit 121 in the above manner.

As describe above, with the semiconductor device 10 according to the present embodiment, in the semiconductor device 10 of a type using an interface chip, it becomes possible to perform a confirmation test to make sure that there is no considerable difference in the delay amount between the current paths not by a process by an external tester but by an internal process of the semiconductor device 10. Furthermore, it becomes possible to perform a redundancy process not by a process by an external tester but by an internal process of the semiconductor device 10.

While a case where one reference signal line 131 is provided has been explained above, it is preferable to prepare a backup internal signal line for the reference signal line 131 just in case there is a problem with the reference signal line 131 and to make them be able to be switched as necessary.

In addition, the signal generation circuit 101 can be provided in the interface chip IF. In this case, the measurement signals are transferred to the core chip through the internal signal lines 132 and 133 and input to the terminals of the measurement-target signal line 130 and the reference signal line 131 in the core chip.

The test-target selection signal is explained in detail below.

Figure 7:
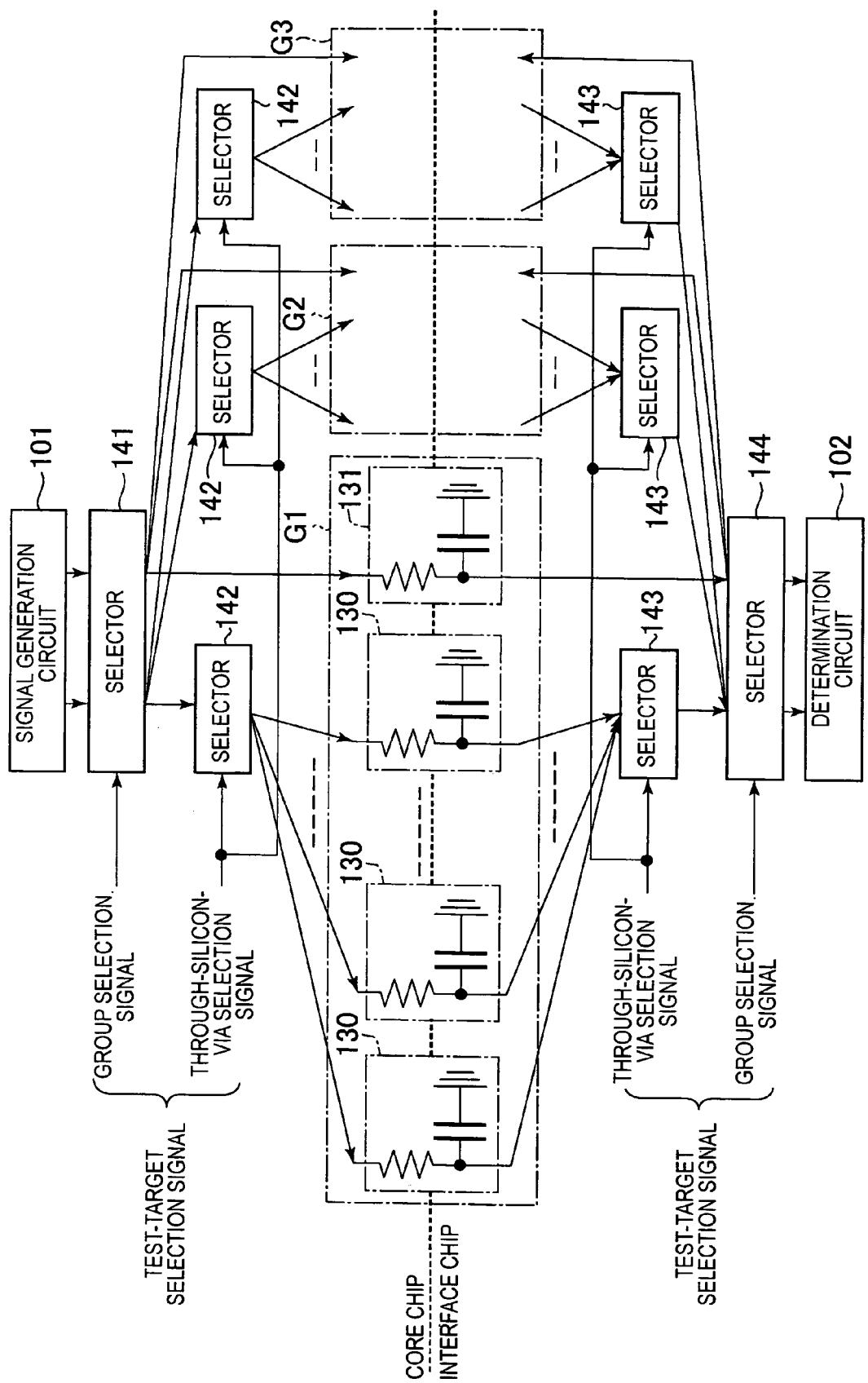
FIG. 7 is a schematic diagram showing how to use the test-target selection signal when there is a plurality of measurement-target signal lines, the measurement-target signal lines are grouped into three group, and the reference signal line is provided for each of the groups.

FIG. 7 is a schematic diagram showing how to use the test-target selection signal when there is a plurality of measurement-target signal lines 130, the measurement-target signal lines 130 are grouped into three groups G1 to G3, and the reference signal line 131 is provided for each of the groups. A specific example of such groups includes an address signal group corresponding to a group of through silicon vias TSV1 to which an address signal is supplied, a control signal group corresponding to a group of through silicon vias TSV1 to which a command signal is supplied, and an I/O data signal group corresponding to a group of through silicon vias TSV1 to which a data signal is supplied.

As shown in FIG. 7, a selector 141 (third selector) and a selector 142 (first selector) are provided between the signal generation circuit 101 and each of the measurement-target signal lines 130. The selector 141 is provided for the signal generation circuit 101, and the selector 142 is provided for each of the groups. Furthermore, a selector 143 (second selector) and a selector 144 (fourth selector) are provided between each of the measurement-target signal lines 130 and the determination circuit 102. The selector 143 is provided for each of the groups, and the selector 144 is provided for the determination circuit 102.

When a plurality of signal generation circuits 101 are provided in the core chip, a plurality of selectors 141 (third selectors) are provided respectively corresponding to the signal generation circuits 101. When a plurality of determination circuits 102 are provided in the interface chip IF, a plurality of selectors 144 (fourth selectors) are provided respectively corresponding to the determination circuits 102. The number of the signal generation circuits 101 and the number of the determination circuits 102 are optional. That is, it is sufficient to set the number of the selectors 141 (third selectors) and the number of the selectors 144 (fourth selectors) corresponding to the number of the signal generation circuits 101 and the number of the determination circuits 102, respectively.

When a plurality of signal generation circuits 101 are provided for each of a plurality of groups, the selector 141 (third selector) is not necessary. Furthermore, when a plurality of signal generation circuits 101 are provided for each of a plurality of measurement-target signal lines 130 of the core chip, the selector 142 (first selector) is not necessary. Also in this case, one reference signal line 131 is sufficient. In the signal generation circuit 101 (see FIG. 5), it is sufficient to include a plurality of transfer gates 113 and 114 corresponding to the measurement-target signal lines 130. It is also easy to set up an alternative method in which a group selection signal for controlling the selector 141 (third selector) and a through-silicon-via selection signal for controlling the selector 142 (first selector) control at least the transfer gates 113 and 114 of the signal generation circuit 101. The selection can be made by a balance between an occupying area of these circuits in the core chip and the precision of the test.

When a plurality of determination circuits 102 are provided for a plurality of groups of the interface chip, the selector 144 (fourth selector) is not necessary. Furthermore, when a plurality of determination circuits 102 are provided for each of a plurality of measurement-target signal lines 130 of the interface chip, the selector 143 (second selector) is not necessary. The same concept can be applied as the selector 141 (third selector) and the selector 142 (first selector).

As shown in FIG. 7, the test-target selection signal includes a group selection signal for selecting a group and a through-silicon-via selection signal for selecting the measurement-target signal line 130. The selector 141 outputs the measurement signal output from the signal generation circuit 101 to the selector 142 and the reference signal line 131 corresponding to the group selected by the group selection signal. The selector 142 outputs the measurement signal output from the selector 141 to the measurement-target signal line 130 selected by the through-silicon-via selection signal. With this process, the measurement signals are input to the measurement-target signal line 130 that is the test target and the reference signal line 131 corresponding to the measurement-target signal line 130.

The selector 143 selects a measurement-target signal line 130 from a plurality of measurement-target signal lines 130 in response to the through-silicon-via selection signal, and outputs a signal output from the selected measurement-target signal line 130 to the selector 144. The selector 144 selects a group from a plurality of groups in response to the group selection signal, and outputs signals output from the selector 143 and the reference signal line 131 corresponding to the selected group to the determination circuit 102. With this process, the measurement signals output from the measurement-target signal line 130 that is the test target and the reference signal line 131 corresponding to the measurement-target signal line 130 are input to the determination circuit 102.

The above processes performed by the selectors 143 and 144 are physically performed by the switches 115 shown in FIG. 5. That is, the switches 115 are provided at the interface chip IF side of each of the measurement-target signal lines 130 and each of the reference signal lines 131, and by controlling the switches 115, the selectors 143 and 144 realize the above processes. The same is true for the selectors 141 and 142, and by controlling switches (not shown) provided at the core chip side of each of the measurement-target signal lines 130 and each of the reference signal lines 131, the above processes are realized.

As described above, with the configuration shown in FIG. 7, it is possible to select a test target group and the measurement-target signal line 130 in response to the test-target selection signal. When performing an actual test, the test is performed for all the groups and the measurement-target signal lines 130 while appropriately changing the group and the measurement-target signal line 130 to be selected. A specific process for performing the actual test is explained below.

Figure 8:
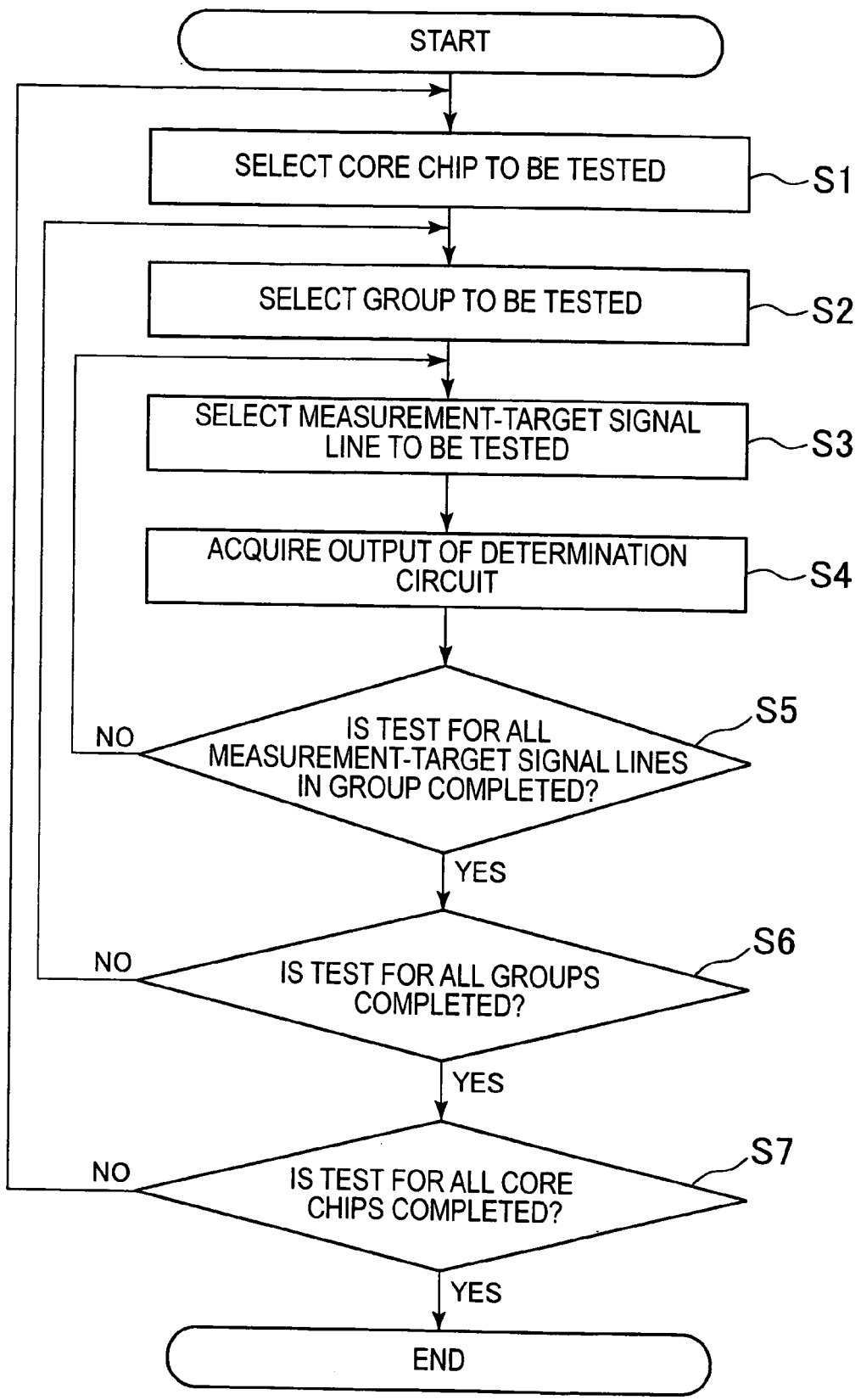
FIG. 8 is a flowchart of a confirmation test performed by the TSV relieving circuit according to the embodiments of the present invention.

FIG. 8 is a flowchart of a confirmation test performed by the TSV relieving circuit 73. As shown in FIG. 8, the TSV relieving circuit 73 first selects a core chip to be tested (Step S1). Specifically, the TSV relieving circuit 73 activates a chip selection signal for selecting the core chip to be tested (see FIG. 5).

Subsequently, the TSV relieving circuit 73 selects a group to be tested (Step S2). Specifically, the TSV relieving circuit 73 generates a group selection signal for selecting the group to be tested, and outputs the group selection signal to the selector 141 and the selector 144 shown in FIG. 7.

The TSV relieving circuit 73 then selects the measurement-target signal line 130 to be tested (Step S3). Specifically, the TSV relieving circuit 73 generates a through-silicon-via selection signal for selecting the measurement-target signal line 130 to be tested, and outputs the through-silicon-via selection signal to the selector 142 and the selector 143 shown in FIG. 7.

With the processes so far, the measurement signals output from the measurement-target signal line 130 to be tested and the reference signal line 131 corresponding to the measurement-target signal line 130 are input to the determination circuit 102. The test result signal corresponding to the input-measurement signals is output from the determination circuit 102, and based on this test result signal, the TSV relieving circuit 73 performs a process of replacing an internal signal line having a large delay amount with a backup internal signal line (Step S4).

Upon completing a test of a measurement-target signal line 130, the TSV relieving circuit 73 determines whether the test is completed for all the measurement-target signal lines 130 in the group (Step S5). When the test is not completed for all the measurement-target signal lines 130 in the group, the TSV relieving circuit 73 returns to Step S3 and selects the next measurement-target signal line 130. When the test is completed for all the measurement-target signal lines 130 in the group, the TSV relieving circuit 73 further determines whether the test is completed for all the groups (Step S6). When the test is not completed for all the groups, the TSV relieving circuit 73 returns to Step S2 and selects the next group. When the test is completed for all the groups, the TSV relieving circuit 73 further determines whether the test is completed for all, the core chips (Step S7). When the test is not completed for all the core chips, the TSV relieving circuit 73 returns to Step S1 and selects the next core chip. When the test is completed for all the core chips, the TSV relieving circuit 73 ends the process.

As described above, with the test flow shown in FIG. 8, it is possible to perform a confirmation test to make sure that there is no considerable difference in the delay amount between the current paths not by a process by an external tester but by an internal process of the semiconductor device 10 for all the core chips, all the groups, and all the measurement-target signal lines 130.

Furthermore, because the reference signal line 131 is provided for each of the groups, it is possible to make the delay amount of the current paths uniform in the group. Although the reference signal line 131 is provided for each of the groups in the present embodiment, it is also sufficient to provide the reference signal line 131 that is common to the groups. However, because it is preferable to set a distance between the reference signal line 131 and the measurement-target signal line 130 as close as possible, it is preferable to provide the reference signal line 131 for each of the groups.

Although there is one signal generation circuit 101 in FIG. 7, the signal generation circuit 101 can be provided for each of, the groups. In this case, a process of selecting the signal generation circuit 101 is performed in response to the group selection signal.

Figure 9:
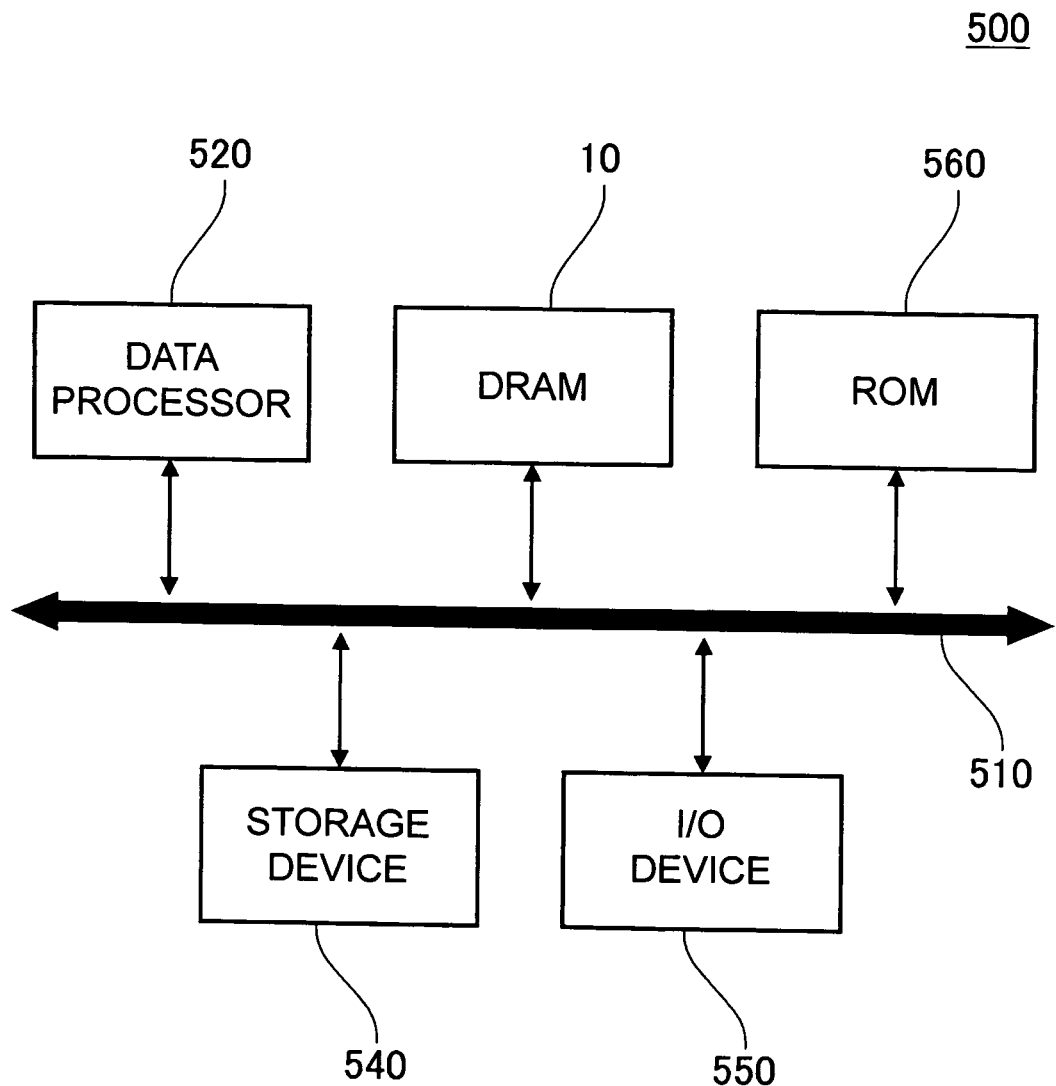
FIG. 9 is a block diagram showing the configuration of a data processing system using the semiconductor memory device according to the embodiments of the present invention.

FIG. 9 is a block diagram showing the configuration of a data processing system 500 using the semiconductor memory device 10 according to the first to ninth embodiment.

The data processing system 500 shown in FIG. 9 has a configuration in which a data processor 520 and the semiconductor device (DRAM) 10 according to this embodiment are mutually connected via a system bus 510. The data processor 520, for example, includes micro-processor (MPU) or digital signal processor (DSP). But it is not limited to them. In FIG. 9, for the sake of shorthand, the data processor 520 and the DRAM 10 are connected via the system bus 510. But they may be connected using a local bus not via the system bus 510.

In FIG. 9, for the sake of shorthand, only one set of the system bus 510 is drawn. But a plurality of system buses 510 may be provided in serial or parallel manner via some connectors etc., if needed. In the data processing system 500 shown in FIG. 9, a storage device 540, I/O device 550, and ROM 560 are also connected to the system bus 510. But these components are not in dispensable.

The storage device 540 may be a hard disk drive, an optical disk drive, or a flash memory. The I/O device 550 may be one or more display devices such as a liquid display, but not limited to, or one or more input devices such as a keyboard, a mouse, but not limited to.

I/O device 550 can be only one of the input device and the output device.

Though only one component is drawn for each of the components shown in FIG. 9, the number of each of the components is not limited to one. The data processing system 500 can include a plurality of each of the components.

In the above embodiments of the present invention, a controller issues a command relating to a read command to an interface chip. The interface chip having received the command from the controller issues the read command to a plurality of core chips. Any of the core chips receives the read command to output read data that is information of memory cell array for the read command to the interface chip. The interface chip having received the read data from any of the core chips outputs that read data to the controller. The command issued by the controller is a so-called command prescribed by a well-known industrial organization controlling semiconductor devices (a read command as a system). The read command issued by the interface chip to the core chip is a control signal within a semiconductor chip. This also applies to the read data. Further, the controller can include a test command (a test signal) for testing the semiconductor device 10. When the test command is issued by the memory controller, the interface chip generates the test signal TEST_IF described above and each core chip generates the test signal TEST_CORE based on the test signal TEST_IF. The test result is then outputted from the semiconductor device 10 to the controller.

It is apparent that the present invention is not limited to the above embodiments, but may be modified and changed without departing from the scope and spirit of the invention.

Various combinations and selections of the components disclosed herein may be made within the scope of the invention. In other words, the present invention of course includes various changes and modifications that are obvious to those skilled in the art according to all the disclosure including the claims and the technical concept.

Various combinations and selections of the components disclosed herein may be made within the scope of the invention. In other words, the present invention of course includes various changes and modifications that are obvious to those skilled in the art according to all the disclosure including the claims and the technical concept.

For example, although measurement of a rising waveform has been disclosed in the embodiment described above, the present invention is not limited thereto, and can be also applied to measurement of a falling waveform or that of a combination of the rising waveform and the falling waveform. Furthermore, in a case of measuring complementary signals, the present invention can be applied to measurement of a cross edge of True and Bar (two reference signal lines are required). In addition, the structure of the TSV is not limited to any particular one.

For example, in the embodiment, the DDR3-type SDRAMs are used as the plural core chips having the same function. However, the present invention is not limited thereto. Accordingly, the core chip may be a DRAM other than the DDR3-type or a semiconductor memory (SRAM (Static Random Access Memory), PRAM (Phase-change Random Access Memory), MRAM (Magnetic Random Access Memory) or a flash memory, for example) other than the DRAM. The core chips may be plural semiconductor chips that have functions other than the functions of the semiconductor memory, which are equal to or different from each other. All of the core chips do not need to be laminated and all or part of the core chips may be two-dimensionally disposed. The number of core chips is not restricted to 8.

The fundamental technical concept of the present invention is not limited to that. For example, the core chips have been described as chips of semiconductor memories having the same function. However, the fundamental technical concept of the present invention is not limited to that, and the core chips may have the same function as one another or different functions from one another. Specifically, the interface chip and the core chips may be silicon chips each having a unique function. For example, the core chips may be DSP chips having the same function, and may have an interface chip (ASIC) shared among the core chips. Preferably, the core chips have the same function as one another, and are manufactured with the use of the same mask. However, the characteristics after the manufacture might vary due to the in-plane distribution in the same wafer, differences among wafers, differences among lots, and the likes. Further, the core chips each have a memory function, but may also have different functions from one another (a first core chip is a DRAM, a second chip is a SRAM, a third chip is a nonvolatile memory, and a fourth chip is a DSP). The core chips may be manufactured with the use of different manufacturing masks from one another, and may have an interface chip (ASIC) shared among the core chips.

The present invention may also be applied to all semiconductor products such as CPUs (Central Processing Units), MCUs (Micro Control Units), DSPs (Digital Signal Processors), ASICs (Application Specific Integrated Circuits), and ASSPs (Application Specific. Standard Products), as long as they are COCs (Chip-on-Chips) that use TSVs. The devices to which the present invention is applied may also be used as the semiconductor devices in SOCs (System-on-Chips), MCPs (Multi Chip Packages), POPs (Package-On-Packages), and the likes. The transistors may be field effect transistors (FETs) or bipolar transistors. The present invention may be applied to various kinds of FETs such as MISs (Metal-Insulator Semiconductors) and TFTs (Thin Film Transistors), other than MOSs (Metal Oxide Semiconductors). The present invention may be applied to various kinds of FETs such as transistors. The transistors may be other transistors than FETs. The transistors may partially include bipolar transistors. Also, p-channel transistors or PMOS transistors are typical examples of the transistors of the first conductivity type, and n-channel transistors or NMOS transistors are typical examples of the transistors of the second conductivity type. Further, the substrate may not necessarily be a p-type semiconductor substrate, and may be an n-type semiconductor substrate, or a semiconductor substrate of a SOI (Silicon on Insulator) structure, or a semiconductor substrate of some other type.

Further, these various circuits (circuit types of the first and second signal generation circuits, the determination circuit, the delay element, the selector and the like) are not limited to the types disclosed in the embodiment described above.

Further, the structures of TSVs are not particularly limited.

What is claimed is:
1. A semiconductor device comprising:
   an interface chip;
   a core chip; and
   a measurement-target signal line and a reference signal line each including a through electrode penetrating through the core chip and each having a first end provided on the core chip and a second end provided on the interface chip, wherein
   the interface chip includes a first signal generation circuit that generates a test clock,
   the core chip includes a second signal generation circuit that generates a measurement signal in synchronization with the test clock, and outputs the measurement signal to the first ends on the core chip of the measurement-target signal line and the reference signal line, and
   the interface chip further includes a determination circuit that outputs a test result signal based on a phase difference between measurement signals respectively appearing at the second ends on the interface chip of the measurement-target signal line and the reference signal line.
2. The semiconductor device as claimed in claim 1, wherein
   the interface chip further includes a phase comparison circuit that detects the phase difference in the measurement signals, and the determination circuit generates the test result signal based on a detection result of the phase comparison circuit.

3. The semiconductor device as claimed in claim 2, wherein the interface chip further includes a delay element provided between the phase comparison circuit and the second end of the reference signal line.

4. The semiconductor device as claimed in claim 2, wherein
the second signal generation circuit generates a plurality of measurement signals in time series,
the determination circuit includes a plurality of storage circuits storing a plurality of detection results output from the phase comparison circuit respectively related to the plurality of measurement signals, and
the determination circuit generates the test result signal based on the detection results stored in the storage circuits.

5. The semiconductor device as claimed in claim 2, wherein
the test clock has at least one active edge making a first transition from a first potential to a second potential or a second transition from the second potential to the first potential or a plurality of active edges making the first and second transitions,
the measurement signal is a signal having an active edge corresponding to the active edge of the test clock, and
the phase comparison circuit detects the phase difference based on the active edge of the measurement signal appearing at the second end of the measurement-target signal line and the active edge of the measurement signal appearing at the second end of the reference signal line.

6. The semiconductor device as claimed in claim 5, wherein
the test clock has a plurality of active edges making a plurality of the first transitions or a plurality of the second transitions, and
the determination circuit generates the test result signal based on a plurality of the detection results of the phase comparison circuit obtained respectively for the active edges.

7. The semiconductor device as claimed in claim 6, wherein
the test clock has active edges making the first and second transitions, and
the determination circuit generates the test result signal based on a plurality of the detection results of the phase comparison circuit obtained respectively for the active edges.

8. The semiconductor device as claimed in claim 1, wherein
a plurality of the core chips mutually stacked are provided,
a plurality of the through electrodes penetrating through different core chips are electrically connected in series, thereby a plurality of the measurement-target signal lines and a plurality of the reference signal lines are configured by the through electrodes electrically connected in series,
each of the core chips further includes a chip-selection reception circuit that receives a selection signal to select one of core chips from the interface chip,
each of the second signal generation circuits provided on the core chips outputs the measurement signal to the first ends of a corresponding measurement-target signal line and a corresponding reference signal line when a corresponding core chip is selected by the chip-selection reception circuit, and each of the second signal generation circuits provided on the core chips does not output the measurement signal to the first ends of the corresponding measurement-target signal line and the corresponding reference signal line when the corresponding core chip is not selected by the chip-selection reception circuit.

9. The semiconductor device as claimed in claim 1, further comprising a plurality of the measurement-target signal lines provided in parallel, wherein
the core chip further includes a first selector that receives a first selection signal to select one of the measurement-target signal lines, and outputs the measurement signal generated by the second signal generation circuit to a selected one of the measurement-target signal lines.

10. The semiconductor device as claimed in claim 9, wherein
the measurement-target signal lines are grouped into a plurality of groups,
a plurality of the first selectors are provided respectively corresponding to the groups, and
the core chip further includes a third selector that receives a third selection signal to select one of the groups, and outputs the measurement signal generated by the second signal generation circuit to the first selector corresponding to a selected one of the groups.

11. The semiconductor device as claimed in claim 10, wherein a plurality of the reference signal lines are assigned for each of the groups.

12. The semiconductor device as claimed in claim 9, wherein the reference signal line is assigned for the plural measurement-target signal lines.

13. The semiconductor device as claimed in claim 1, further comprising a plurality of the measurement-target signal lines provided in parallel, wherein
the interface chip further includes a second selector that receives a second selection signal to select one of the measurement-target signal lines, and outputs the measurement signal output from a selected one of the measurement-target signal lines to the determination circuit.

14. The semiconductor device as claimed in claim 13, wherein
the measurement-target signal lines are grouped into a plurality of groups,
a plurality of the second selectors are provided respectively corresponding to the groups, and
the interface chip further includes a fourth selector that receives a fourth selection signal to select one of the groups, and outputs the measurement signal output from the second selector corresponding to a selected one of the groups to the determined circuit.

15. The semiconductor device as claimed in claim 1, further comprising a plurality of the measurement-target signal lines provided in parallel, wherein
the core chip further includes a first selector that receives a first selection signal to select one of the measurement-target signal lines, and outputs the measurement signal generated by the second signal generation circuit to a selected one of the measurement-target signal lines,
the interface chip further includes a second selector that receives a second selection signal to select one of the measurement-target signal lines, and outputs the measurement signal output from a selected one of the measurement-target signal lines to the determination circuit,
the measurement-target signal lines are grouped into a plurality of groups,
a plurality of the first selectors are provided respectively corresponding to the groups, and the core chip further includes a third selector that receives a third selection signal to select one of the groups, and outputs the measurement signal generated by the second signal generation circuit to the first selectors corresponding to a selected one of the groups,
a plurality of the second selectors are provided respectively corresponding to the groups, and
the interface chip further includes a fourth selector that receives a fourth selection signal to select one of the groups, and outputs the measurement signals output from the second selectors corresponding to a selected one of the groups to the determined circuit.

16. The semiconductor device as claimed in claim 15, wherein
a plurality of the reference signal lines are assigned for each of the groups,
the third selector outputs the measurement signal generated by the second signal generation circuit to the reference signal line corresponding to the selected group, and
the fourth selector outputs the measurement signal output from the reference signal line corresponding to the selected group to the determination circuit.

17. The semiconductor device as claimed in claim 1, further comprising a first signal line that includes a through electrode penetrating through the core chip and connected between the first signal generation circuit and the second signal generation circuit, wherein
the test clock output from the first signal generation circuit is supplied to the second signal generation circuit via the first signal line.

18. The semiconductor device as claimed in claim 1, wherein
the first signal generation circuit further generates a test trigger indicating a test mode,
the semiconductor device further comprises a second signal line that includes a through electrode penetrating through the core chip and connected between the first signal generation circuit and the second signal generation circuit,
the test trigger output from the first signal generation circuit is supplied to the second signal generation circuit via the second signal line, and
the second signal generation circuit determines whether to generate the measurement signal based on the test trigger.

19. The semiconductor device as claimed in claim 1, further comprising:
an external terminal with which the semiconductor device communicates with outside; and
a first circuit included in the interface chip having an input terminal and an output terminal, wherein
the external terminal is connected to the input terminal of the first circuit, and
the output terminal of the first circuit is connected to the second end of the measurement-target signal line.

20. A testing method of a semiconductor device comprising:
providing the semiconductor device that includes a core chip including a plurality of through electrodes penetrating therethrough and an interface chip stacked on the core chip, the through electrodes constitute a first signal line, a measurement-target signal line, and a reference signal line that are connected between the core chip and the interface chip, respectively;
outputting a test clock having a predetermined cycle from the interface chip to the first signal line;
generating a measurement signal in the core chip in synchronization with the test clock supplied via the first signal line and outputting the measurement signal to the measurement-target signal line and the reference signal line in a simultaneous manner; and
detecting a phase difference of a plurality of the measurement signals on the interface chip respectively supplied via the measurement-target signal line and the reference signal line.

* * * * *